United States Patent
Furuzawa et al.

[11] Patent Number: 5,926,026
[45] Date of Patent: Jul. 20, 1999

[54] MALE TERMINAL INSPECTING TOOL OF CONNECTOR

[75] Inventors: Shigezou Furuzawa; Yoshihiro Nishimura, both of Shiga, Japan

[73] Assignees: Furukawa Electric Co., Ltd., Tokyo, Japan; OHMI Electric Wire Co., Ltd., Shiga, Japan

[21] Appl. No.: 08/860,969

[22] PCT Filed: Nov. 13, 1996

[86] PCT No.: PCT/JP96/03329

§ 371 Date: Oct. 14, 1997

§ 102(e) Date: Oct. 14, 1997

[87] PCT Pub. No.: WO97/18478

PCT Pub. Date: May 22, 1997

[30] Foreign Application Priority Data

Nov. 14, 1995 [JP] Japan ................................. 7-295474

[51] Int. Cl.[6] ............................................... H01H 32/04
[52] U.S. Cl. .......................... 324/538; 324/542; 439/912
[58] Field of Search .................... 439/488, 489, 439/490, 912; 324/538, 542

[56] References Cited

U.S. PATENT DOCUMENTS

| 5,586,900 | 12/1996 | Yagi | 324/538 |
| 5,701,079 | 12/1997 | Yagi | 324/538 |

FOREIGN PATENT DOCUMENTS

| 5-87877 | 11/1993 | Japan . |
| 6-20314 | 1/1994 | Japan . |
| 6-37346 | 2/1994 | Japan . |

*Primary Examiner*—Josie Ballato
*Assistant Examiner*—Jose M. Solis
*Attorney, Agent, or Firm*—Armstrong, Westerman, Hattori, McLeland and Naughton

[57] ABSTRACT

A male terminal inspecting tool of a connector (11) has a connector holder (2), a pin receiver (3) which is movably arranged at a position opposite to the connector holder (2) and has a conductive pin (4) inside it, and an operation lever (6), characterized in that a hole or slit (15) having the smallest dimension into which the front end portion of the male terminal (19) of the connector (11) can inserted is provided in the vicinity of the conductive pin (4) in the pin receiver (3).

3 Claims, 5 Drawing Sheets

MALE TERMINAL INSPECTING TOOL OF CONNECTOR

TECHNICAL FIELD

The present invention relates to a male terminal inspecting tool of a connector for performing inspection of conduction of the male terminal of a connector used in a wire harness in a vehicle, for example, an automobile.

BACKGROUND ART

A conventional male terminal inspecting tool of a connector will be explained first.

FIG. 1A is a front view of a conventional male terminal inspecting tool of a connector; and FIG. 1B is a plan view of the conventional male terminal inspecting tool of a connector.

Reference numeral 21 indicates a base frame, and reference numeral 22 indicates a connector holder attached to the base frame 21. The connector holder 22 holds a connector 31 to be inspected.

Reference numeral 23 indicates a pin receiver moving in a left and right direction in the figure along a guide key 32. The pin receiver 23 is biased to the leftward direction in the figure by a coil spring 30 attached to a guide shaft 27 fixed to the base frame 21 and is located at an illustrated position where an operation lever 26 is not operated. An engagement depression 25 engaging with a front end portion of the connector 31 is provided in the pin receiver 23, and a conductive pin 24 for performing the conduction inspection is provided in the engagement depression 25.

An insulator cap 38 having a hole into which the male terminal of the connector 31 to be inspected can be inserted is provided at the center of the front end of the conductive pin 24. When the conductive pin 24 moves toward the male terminal of the connector 31 by the pivoting of the operation lever 26, if the male terminal of the connector 31 is normal, the male terminal of the connector 31 will be inserted into that hole. However, where there is abnormal deformation or the like in the male terminal of the connector 31, the male terminal will not be inserted into that hole at the inspection of conduction, but will be caught by the insulator cap 38 or turned away to the side of the insulator cap 38, so it cannot contact with the conductive pin 24, and thus the male terminal of the connector 31 and the conductive pin 24 will not be conductive. By detecting this nonconductive state, an abnormality of the male terminal of the connector 31 can be electrically detected.

Reference numeral 26 indicates the operation lever. As illustrated in FIG. 2, by pivoting this in a clockwise direction A, the left end portion of the pin receiver 23 is brought into contact with the cam surface of the operation lever 26, and the pin receiver 23 is moved to the right direction R. Further, the operation lever 26 pivots about a pivot pin 28. When it is not operated, the pivoting is stopped by a lever stopper 29.

FIG. 2 is an explanatory view showing the operation state at the conduction inspection of the male terminal inspecting tool of a connector shown in FIG. 1A and FIG. 1B.

When inspecting for conduction of the connector 31, the connector 31 is mounted on the connector holder 22 and the operation lever 26 is pivoted in the clockwise direction A in FIG. 2. By this, the pin receiver 23 moves to the right direction R in FIG. 2 against a biasing force of the coil spring 30 attached to the guide shaft 27, and the engagement depression of the pin receiver 23 engages with the front end portion of the male terminal of the connector 31.

Here, where the male terminal 39 of the connector 31 is normal as designed, the male terminal 39 will be inserted into the hole at which the insulator cap 38 is provided and will contact the conductive pin 24. By electrically detecting this contact state, for example by turning on a lamp or the like, it can be detected if the male terminal 39 is normal.

However, in the conventional male terminal inspecting tool of a connector, the conductive pin 24 exhibits a column-like shape having an outer diameter of about 0.2 to 0.3 mm, but in contrast, the male terminal 39 of the connector 31 which becomes the opposite side of contact exhibits a block-like shape having a width of about 1 to 3 mm, therefore the allowable range of contact with the front end of the conductive pin 24, i.e., the so-called "conductable range", is large, so there is the inconvenience that even if the male terminal 39 of the connector 31 is slightly bent, it will not be inserted into the hole of the conductive pin 24 resulting in "defect" state (or abnormal state) outside of the designed value and a correct inspection result cannot be obtained.

Further, where the front end of the conductive pin 39 deviates in position due to an unexpected cause, even if the male terminal 39 of the connector 31 suffers from abnormal deformation, it may contact the area near the center portion of the longitudinal direction of the conductive pin 39 while missing the insulator cap 38 at the front end of the conductive pin 24. In this case, in spite of the fact that the male terminal 39 of the connector 31 is defective (abnormal), when the conduction state is electrically detected, there is a possibility of an erroneous recognition that it is normal due to the conduction.

Further, in the conventional male terminal inspecting tool of a connector, when the male terminal 39 of the connector 31 is defective, if the operation lever 26 is pivoted too much, the male terminal 39 of the connector 31 which is not inserted into the hole of the conductive pin 24 will be bent by a large amount on the periphery of the insulator cap 38 and the male terminal 39 of the connector 31 will be broken.

DISCLOSURE OF THE INVENTION

An object of the present invention is to provide a male terminal inspecting tool of a connector with which the normal state or abnormal state of a connector requiring a high dimensional precision can be correctly inspected.

Another object of the present invention is to provide a male terminal inspecting tool of a connector with which the normal state or abnormal state of a connector can be quickly inspected without breaking the male terminal of the connector.

Still another object of the present invention is to provide a male terminal inspecting tool of a connector with which the normal state or abnormal state of a connector can be quickly and easily determined.

According to the present invention, there is provided a male terminal inspecting tool of a connector having a connector holder for supporting a connector having a conductive male terminal, a pin receiver which is movably arranged at a position opposite to the connector holder and has a conductive pin inside it, and an operation lever and inspecting the male terminal of the connector by contact or noncontact of the male terminal of the connector held by the connector holder and the conductive pin by pushing the pin receiver toward the connector by the operation of the operation lever, characterized in that a hole or slit having the smallest dimension into which the front end portion of the male terminal of the connector can be inserted is provided in the vicinity of the conductive pin in the pin receiver.

In the vicinity of the conductive pin, provision is made of a pin receiver having the smallest hole or slit against which the front end portions of both of the conductive pin and male terminal can abut and into which the front end portion (flat plate part) of the male terminal is inserted formed therein, therefore a male terminal of a connector having a dimensional precision exceeding the permissible range is caught by the pin receiver. Accordingly, the defective male terminal of the connector out of the permissible range (substandard) does not become conductive with the conductive pin. In this way, although according to the dimensional precision of the parts, an inspection of considerably high dimensional precision can be carried out depending upon the design of the smallest hole or slit.

Further, according to the present invention, preferably, there is a pivot pin biasing coil spring connected to a pivot pin provided in a pivot shaft for the pivoting of the operation lever. The pivot pin biasing coil spring absorbs the reaction force of pressure applied upon the front end of the male terminal of the connector in a manner so that the reaction force of the pressure applied upon the front end of the male terminal of the connector which is not inserted into the hole or slit due to the operation of the operation lever biases the pivot pin via the pin receiver, the operation lever, and the pivot pin and so that the pivot pin and the lower end portion of the operation lever move via the compression of the pivot pin biasing coil spring.

As a result, where the male terminal of the connector is defective and is not inserted into the smallest hole or slit, the break of the connector caused by operating the operation lever can be prevented without occurrence of bending etc. of the male terminal of the connector.

According to the present invention, further preferably provision is made of a conduction state indicating means for supplying electric power to the conductive pin and the male terminal of the connector, inspecting the conduction state thereof, and indicating the result of this. By this indicating means, the normal state or abnormal state of the connector can be quickly and easily determined.

BRIEF DESCRIPTION OF THE DRAWINGS

The above and other object and features of the present invention will be more apparent from the following description given with reference to the accompanying drawings, wherein.

BEST MODE FOR CARRYING OUT THE INVENTION

An embodiment of the male terminal inspecting tool of a connector of the present invention will be explained next by referring to FIG. 3A and FIG. 3B to FIG. 5A to FIG. 5C.

The configuration of the male terminal inspecting tool of a connector of the embodiment of the present invention will be explained in comparison with the conventional male terminal inspecting tool of a connector explained above.

Figure 1A:
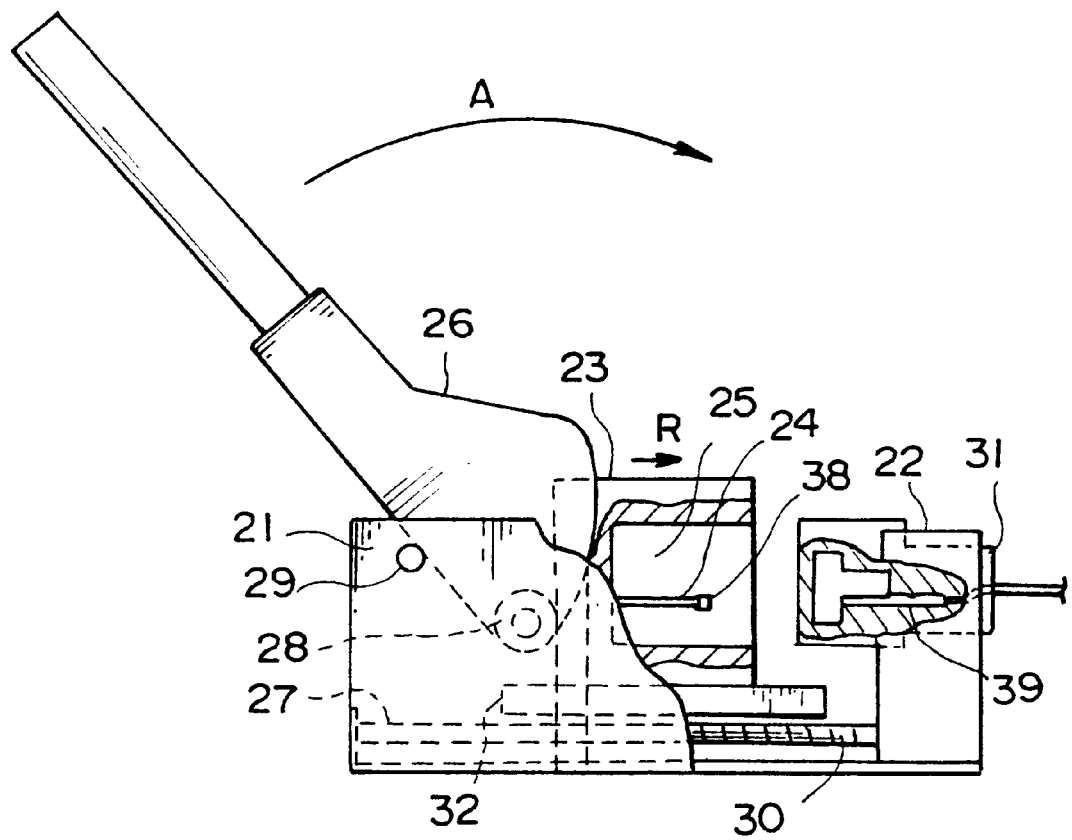
FIG. 1A is a front view of a conventional male terminal inspecting tool of a connector.
Figure 1B:
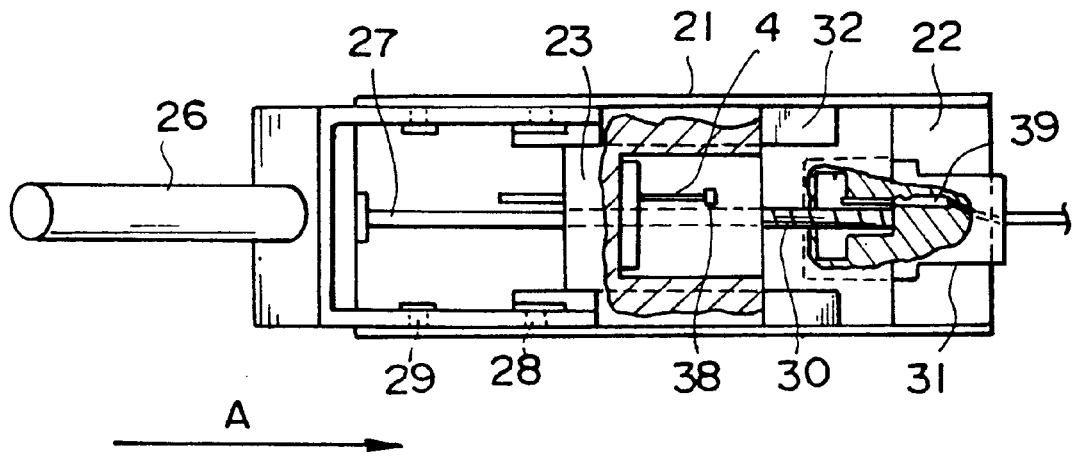
FIG. 1B is a front view of the male terminal inspecting tool of a connector illustrated in FIG. 1A.
Figure 2:
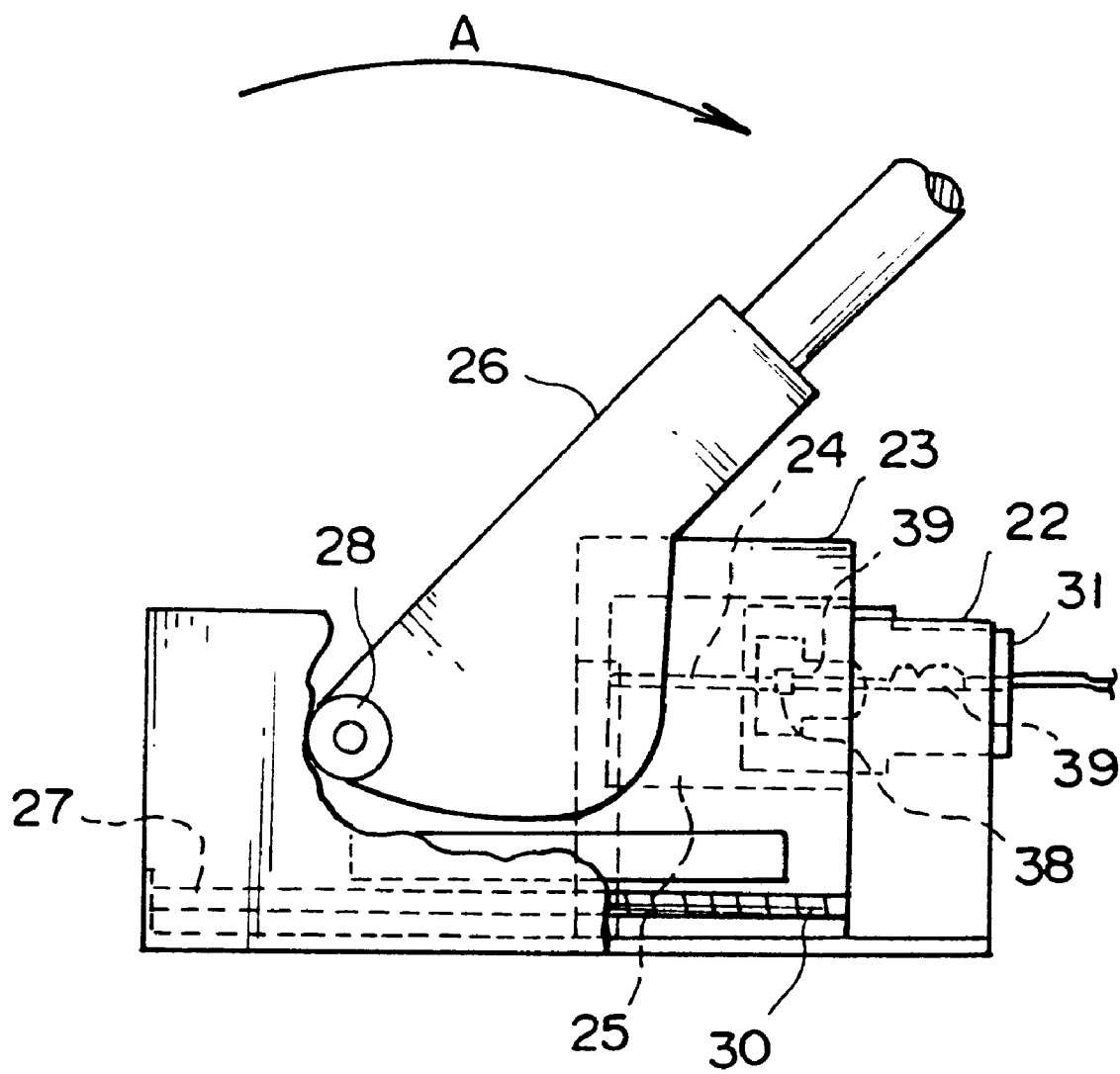
FIG. 2 is an explanatory view showing an operation state of the male terminal inspecting tool of a connector illustrated in FIG. 1A and FIG. 1B.

The male terminal inspecting tool of a connector according to the embodiment of the present invention basically has constituent elements similar to those of the male terminal inspecting tool of a connector illustrated in FIG. 1A and FIG. 1B. Namely, the male terminal inspecting tool of a connector of the embodiment of the present invention has a basic frame 1 corresponding to the basic frame 21 illustrated in FIG. 1A and FIG. 1B, a connector holder 2 corresponding to the connector holder 22, a pin receiver 3 corresponding to the pin receiver 23, a conductive pin 4 corresponding to the conductive pin 24, an operation lever 6 corresponding to the operation lever 26, a guide shaft 7 corresponding to the guide shaft 27, a pivot pin 8 corresponding to the pivot pin 28, a lever stopper 9 corresponding to the lever stopper 29, a coil spring 10 corresponding to the coil spring 30, a connector 11 corresponding to the connector 31, a guide key 12 corresponding to the guide key 32, and a male terminal 19 of a connector corresponding to the male terminal 39.

In the male terminal inspecting tool of a connector of the embodiment of the present invention, the connector holder 2 is attached to the base frame 1. The connector holder 2 holds the connector 11 to be inspected. The pin receiver 3 is a pin receiver which moves in the left and right direction in FIG. 3A and FIG. 3B along the guide key 12, is biased to the leftward direction in FIG. 3A and FIG. 3B by the coil spring 10 attached to the guide shaft 7 fixed to the base frame 1, and is located at the position shown in FIG. 3A and FIG. 3B when the operation lever 6 is not operated. An engagement depression engaging with the front end portion of the connector 11 is provided in the pin receiver 3, and the conductive pin 4 for performing the inspection of conduction is provided in the engagement depression.

Figure 3A:
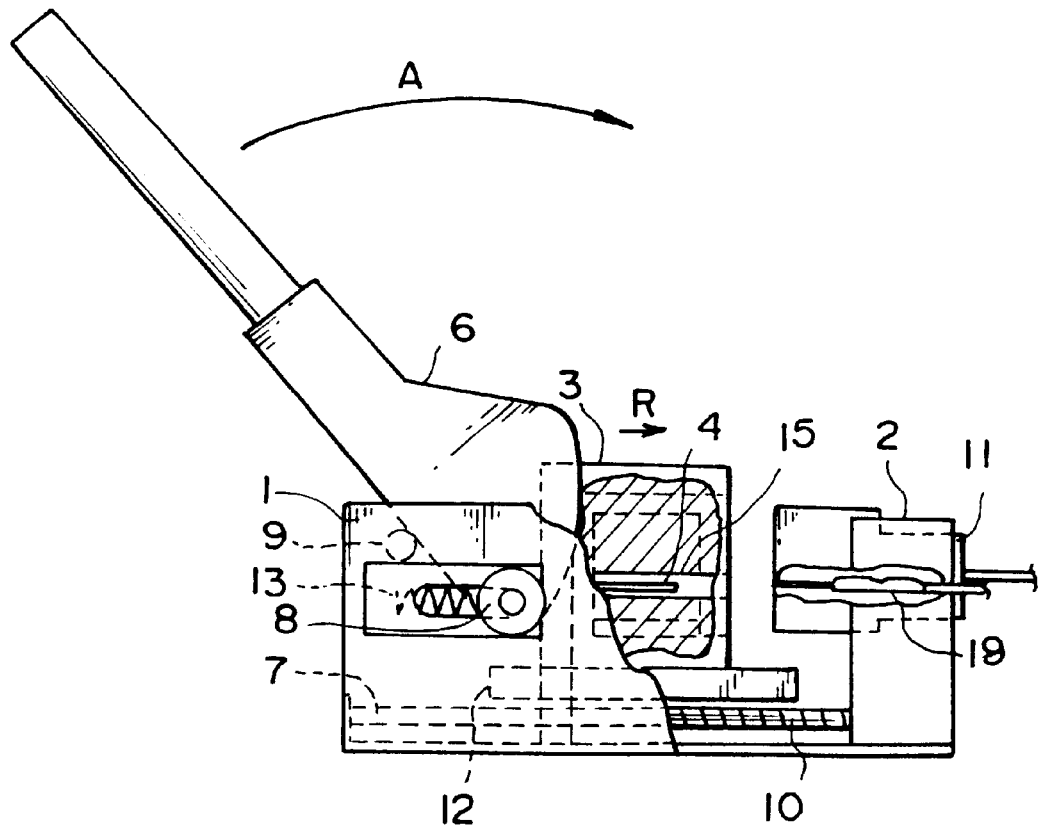
FIG. 3A is a front view of the male terminal inspecting tool of a connector of an embodiment of the present invention.
Figure 3B:
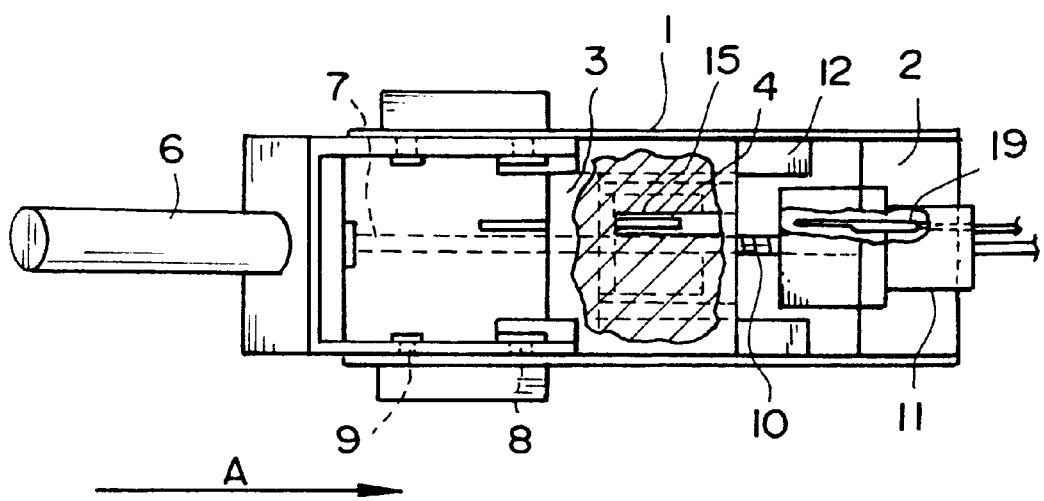
FIG. 3B is a plan view of the male terminal inspecting tool of a connector illustrated in FIG. 3A.

As the first characteristic feature of the male terminal inspecting tool of a connector of the embodiment of the present invention, in place of the pin receiver 23 having the insulator cap 38 in the male terminal inspecting tool of a connector illustrated in FIG. 1A and FIG. 1B, as illustrated in FIG. 3A and FIG. 3B, the pin receiver 3 in which is formed the smallest hole or slit 15 into which the front end portion of the male terminal 19 of the connector may be sufficiently inserted is provided in the vicinity of the conductive pin 4.

As a second characteristic feature of the male terminal inspecting tool of a connector of the embodiment of the present invention, the pivot pin biasing coil spring 13 biasing the pivot pin 8 is provided.

Also in the male terminal inspecting tool of a connector of the embodiment of the present invention, similar to the conventional male terminal inspecting tool of a connector mentioned above, provision is made of the connector holder 2 supporting the connector and the pin receiver 3 pushed to the connector holder 2 side by the operation of the operation lever 6. When the pin receiver 3 is pushed toward the connector 11 held at the connector holder 2, the conductive pin 4 provided in the pin receiver 3 contacts with the male terminal 19 of the connector held by the connector holder 2. It has a structure enabling inspection of whether or not the male terminal 19 of the connector 11 is normal by the conduction of the male terminal 19 of the connector and the conductive pin 4.

In the male terminal inspecting tool of a connector of the embodiment of the present invention, however, the conductive pin 4 is contained in the smallest hole or slit 15. The size of the smallest hole or slit is determined to be a size such that the front end portions of both of the conductive pin 4 and the male terminal 19 can abut against each other and sufficient for the insertion of the front end portion (flat plate part) of the male terminal 19 of the connector 11. As a result, when the operation lever 6 is pivoted, the male terminal 19 of the connector having a dimensional precision exceeding the permissible range will not fit in the smallest hole or slit 15 and will be caught by the pin receiver 3, therefore the defective male terminal 19 of the connector out of the permissible range (substandard) will not contact the conductive pin 4 of the pin receiver 3. In this way, although according to the dimensional precision of the parts, the present embodiment is constituted so that inspection of a considerably high dimensional precision can be carried out depending upon the design of dimension of the smallest hole or slit 15.

The operation lever 6 is an operation lever which contacts the left end portion of the pin receiver 3 in the cam surface thereof when pivoted in the clockwise direction A in FIG. 3 and moves the pin receiver 3 to the right direction R in FIG. 3A and FIG. 3B. The operation lever 6 pivots about the pivot pin 8. When it is not operated, the pivoting is stopped by the lever stopper 9 as shown in FIG. 3A and FIG. 3B.

Figure 4:
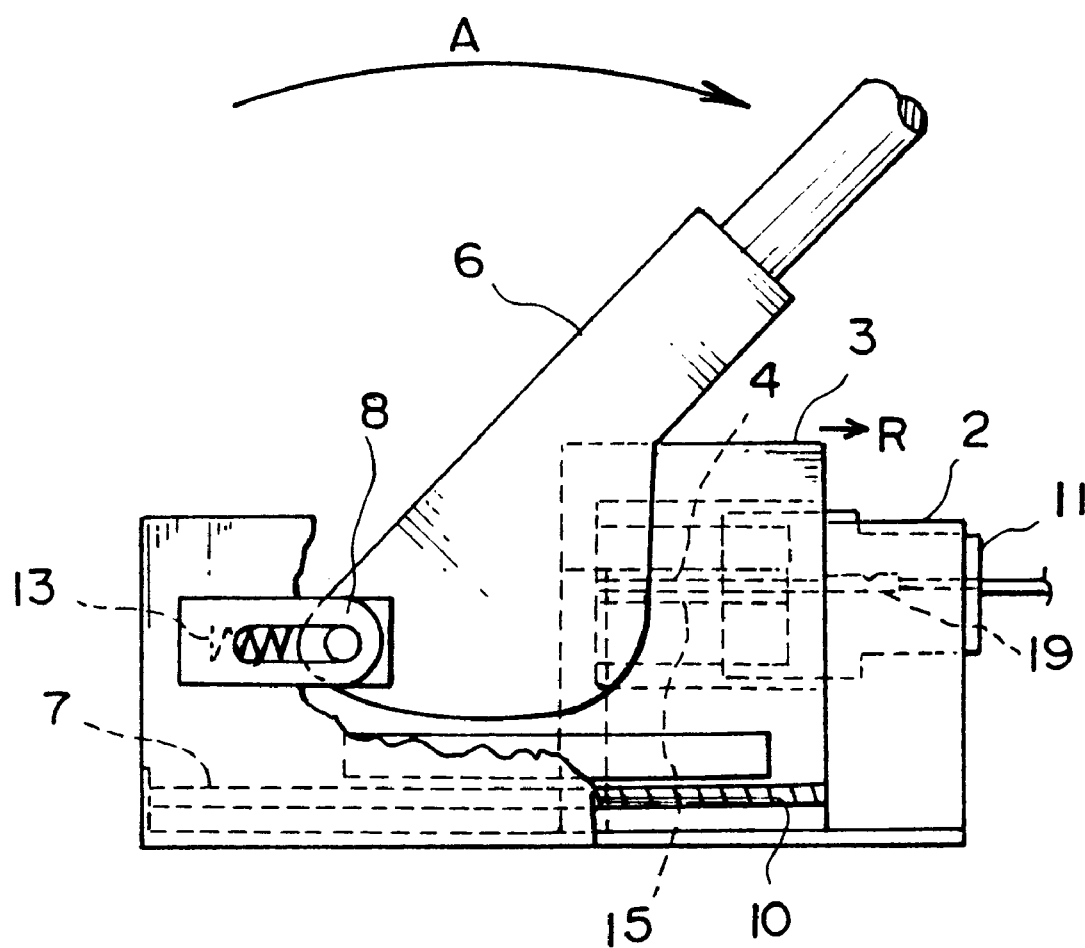
FIG. 4 is an explanatory view showing the operation state of the male terminal inspecting tool of a connector of the embodiment of the present invention illustrated in FIG. 3A and FIG. 3B.

FIG. 4 is an explanatory view showing the operation state at the inspection of conduction by the male terminal inspecting tool of a connector shown in FIG. 3A and FIG. 3B.

When inspecting the conduction of the male terminal 19 of the connector 11, the connector 11 is mounted on the connector holder 2, and the operation lever 6 is pivoted in the clockwise direction A in FIG. 4. By this, the pin receiver 3 moves toward the connector 11 attached to the connector holder 2 which is the right direction R in FIG. 4 against the biasing force of the coil spring 10 attached to the guide shaft 7, and the engagement depression of the pin receiver 3 engages with the front end portion of the connector 11.

When the male terminal 19 of the connector is normal, the male terminal 19 of the connector is inserted into the smallest hole or slit 15 of the conductive pin 4, therefore the conductive pin 4 and the male terminal 19 of the connector become conductive. By detecting this conductive state, it can be detected that the male terminal 19 of the connector is normal.

If the dimensions of the male terminal 19 of the connector 11 are substandard or there is bending out of the permissible range, the male terminal 19 of the connector will not be able to be inserted into the hole or slit 15 and will be caught by the pin receiver 3, therefore the conductive pin 4 and the male terminal 19 will not contact. Namely, the conductive pin 4 and the male terminal 19 of the connector will not become conductive.

When the male terminal 19 of the connector cannot be inserted into the smallest hole or slit 15, when the operation lever 6 is further pivoted in the clockwise direction A in FIG. 4, the pin receiver 3 further moves toward the connector 11 and a considerably large stress is applied upon the male terminal 19 of the connector which has not been inserted into the smallest hole or slit 15. However, the reaction force by the pressure of front end of the male terminal 19 of the connector acts upon the pivot pin biasing coil spring 13 biasing the pivot pin 8 via the pin receiver 3, the operation lever 6, and the pivot pin 8, therefore the pivot pin 8 and accordingly the lower end portion of the operation lever 6 move backward via the compression of the pivot pin biasing coil spring 13 and absorb this reaction force. As a result, when the male terminal 19 of the connector is not inserted into the smallest hole or slit 15, even if the operation lever 6 is pivoted up to the limit of pivoting thereof, the pin receiver 3 does not advance at all to the rightward direction in FIG. 4, the male terminal 19 of the connector 11 is not pushed either, and thus the breakage of the connector 11, for example, the bending of the male terminal 19 of the connector, can be prevented.

Note that, the male terminal inspecting tool of a connector according to the embodiment of the present invention can be utilized also as a detector for detecting the lack of mounting of a male terminal 19 of the connector.

A detailed explanation will be made next of the conductive pin 4 and the vicinity thereof by referring to FIG. 5A to FIG. 5C.

Figure 5A:
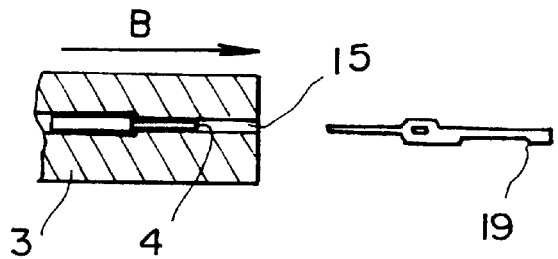
FIG. 5A is a view showing an arrangement of the male terminal, a conductive pin, and a pin receiver before the inspection of conduction of the male terminal inspecting tool of a connector of the present invention.

As shown in FIG. 5A, the conductive pin 4 is contained in the smallest hole or slit 15 into which the front end portion of the male terminal 19 formed on the pin receiver 3 is sufficiently inserted. The specific dimensions of this smallest hole or slit 15 depend upon the designed value adapted to the permissible range of the dimensions of the male terminal 19 of the connector and deformation of the male terminal 19.

Figure 5B:
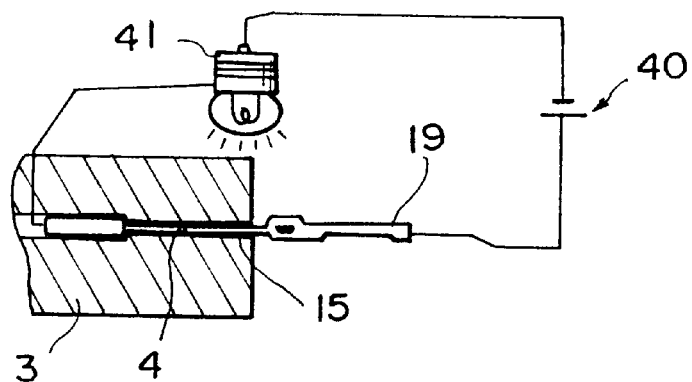
FIG. 5B is an explanatory view showing the operation state when the conduction was confirmed before performing the inspection of conduction by using the male terminal inspecting tool of a connector of the embodiment of the present invention.

Note that, as mentioned above, the pin receiver 3 containing the conductive pin 4 moves in a (right) direction indicated by an arrow B shown in FIG. 5A by pivoting the operation lever 6 in the clockwise direction.

Where the connector 11 has the dimensions as designed, for example, as shown in FIG. 5B, a circuit in which a power source 40 and a lamp 41 are connected to the conductive pin 4 and the male terminal 19 of the connector is closed, the lamp 41 is turned on, and thus the conduction state can be informed to the inspection worker.

Figure 5C:
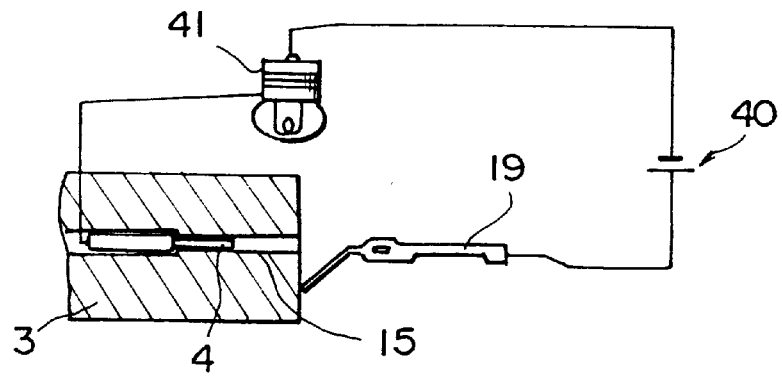
FIG. 5C is an explanatory view showing the operation state when the nonconduction was confirmed as a result of performing the inspection of conduction by using the male terminal inspecting tool of a connector of the embodiment of the present invention.

Contrary to this, where the connector does not have the dimensions as designed, for example, when the front end of the male terminal 19 of the connector is bent to an extent exceeding the permissible amount as shown in FIG. 5C, the front end of the male terminal 19 is caught by the pin receiver 3. By this, a state where the circuit in which the power source 40 and the lamp 41 are connected to the conductive pin 4 and the male terminal 19 is open midway is exhibited and the lamp 41 is not turned on. By this turning off state, the nonconduction state can be informed to the inspection worker.

Further, while a case where the male terminal inspecting tool of a connector according to the first embodiment of the present invention is applied to a wire harness of a vehicle such as an automobile was exemplified, needless to way the male terminal inspecting tool of a connector of the present invention can be used also in various electrical components other than those of a vehicle, in the electrical wiring circuits of buildings, etc.

The male terminal inspecting tool of a connector of the present invention is constituted so that, by providing a pin receiver having the smallest hole or slit into which the front end portion of the male terminal can be sufficiently inserted formed in the vicinity of the conductive pin, where there is an abnormality where the male terminal of the connector will deviate in position out of the permissible range, even if very small, it will not be able to contact the inspection pin, therefore the defective or abnormal male terminal can be correctly detected.

Further, according to the male terminal inspecting tool of a connector of the present invention, when there is a defect, abnormality, or the like in the male terminal of the connector, even if the operation lever is further operated, breakage of the connector can be prevented.

Further, according to the male terminal inspecting tool of a connector of the present invention, the normality or defect of the male terminal of the connector can be quickly and easily distinguished.

LIST OF REFERENCE NUMERALS 1 base frame;
2 connector holder;
3 pin receiver;
4 conductive pin;
6 operation lever;
7 guide shaft;
8 pivot pin;
9 lever stopper;
10 coil spring;
11 connector;
12 guide key;
13 pivot pin biasing coil spring;
15 smallest hole or slit;
19 male terminal of connector;
40 power source; and
41 lamp.

INDUSTRIAL APPLICABILITY

The male terminal inspecting tool of a connector of the present invention can be applied to automatic inspection of various male terminals of connectors used for the wire harnesses of vehicles etc.

We claim:

1. A male terminal inspecting tool of a connector, comprising:

a connector holder for supporting a connector having a conductive male terminal;

a pin receiver, movably arranged at a position opposite to the connector holder, including a hole or slit therewithin;

a conductive pin being in axial alignment with the hole or slit and fixedly connected to said pin receiver; and an operation lever, wherein the male terminal of said connector is inspected by contact or noncontact of the male terminal of said connector held by said connector holder with said conductive pin by pushing of said pin receiver toward said connector by the operation of the operation lever, and wherein the hole or slit has the smallest dimension into which the front end portion of the male terminal of said connector can be inserted is provided in the vicinity of said conductive pin in said pin receiver.

2. A male terminal inspecting tool of a connector according to claim 1, further comprising a pivot pin biasing coil spring (13) connected to a pivot pin (8) provided in a pivot shaft for pivoting of said operation lever (6);

wherein the pivot pin biasing coil spring (13) absorbs the reaction force of pressure applied upon the front end of the male terminal (19) of said connector in such a manner that the reaction force of the pressure applied upon the front end of the male terminal (19) of said connector which is not inserted into said hole or slit (15) due to the operation of said operation lever (6) biases the pivot pin (8) via said pin receiver (3), said operation lever (6), and said pivot pin (8), and said pivot pin (8) and the lower end portion of said operation lever (6) move via the compression of the pivot pin biasing coil spring (13).

3. A male terminal inspecting tool of a connector according to claim 1 or 2, further comprising conduction state indicating means (40, 41) for supplying electric power to said conductive pin (4) and the male terminal (19) of said connector, inspecting the conduction state thereof, and indicating the result of this.

* * * * *

UNITED STATES PATENT AND TRADEMARK OFFICE
CERTIFICATE OF CORRECTION

PATENT NO.:    5,926,026
DATED      :    July 20, 1999
INVENTOR(S):  FURUZAWA et al.

It is certified that error appears in the above-identified patent and that said Letters Patent is hereby corrected as shown below:

On the title page of the patent change item [73], the assignee, "Furukawa Electric Co., Ltd.," to be --The Furukawa Electric Co., Ltd.,--.

Signed and Sealed this

Fourth Day of July, 2000

Attest:

Attesting Officer

Q. TODD DICKINSON

Director of Patents and Trademarks